United States Patent
Lee et al.

(10) Patent No.: US 8,853,606 B2
(45) Date of Patent: Oct. 7, 2014

(54) IMAGE SENSOR CELL, IMAGE SENSOR INCLUDING IMAGE SENSOR ARRAY INCLUDING PLURALITY OF THE IMAGE SENSOR CELLS, AND CAMERA SYSTEM INCLUDING THE IMAGE SENSOR

(75) Inventors: Kyung-ho Lee, Bucheon-si (KR); Hoon-sang Oh, Seongnam-si (KR); Jung-chak Ahn, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 521 days.

(21) Appl. No.: 13/213,145

(22) Filed: Aug. 19, 2011

(65) Prior Publication Data

US 2012/0049043 A1    Mar. 1, 2012

(30) Foreign Application Priority Data

Aug. 24, 2010 (KR) .................. 10-2010-0082086

(51) Int. Cl.
*H01L 27/146* (2006.01)
(52) U.S. Cl.
CPC .... *H01L 27/14603* (2013.01); *H01L 27/14616* (2013.01); *H01L 27/14641* (2013.01); *H01L 27/14614* (2013.01)
USPC .................................................. 250/208.1

(58) Field of Classification Search
CPC ........................ H01L 31/062; H01L 31/113
USPC ............................... 250/208.1; 257/290–292
See application file for complete search history.

(56) References Cited

U.S. PATENT DOCUMENTS

| | | | | |
|---|---|---|---|---|
| 6,844,591 | B1 * | 1/2005 | Tran | 257/330 |
| 7,768,047 | B2 * | 8/2010 | Mauritzson et al. | 257/292 |
| 8,581,349 | B1 * | 11/2013 | Sekar et al. | 257/402 |
| 2005/0224901 | A1 | 10/2005 | He | |

FOREIGN PATENT DOCUMENTS

| | | |
|---|---|---|
| JP | 64-037869 | 2/1989 |
| JP | 2004-281499 | 10/2004 |
| KR | 10-2010-0022545 A | 3/2010 |

* cited by examiner

*Primary Examiner* — Seung C Sohn
(74) *Attorney, Agent, or Firm* — Lee & Morse, P.C.

(57) ABSTRACT

An image sensor cell, wherein at least one of a plurality of transistors included in image sensor cell is a recess transistor having a channel region recessed into a substrate. The image sensor cell includes an image charge generating unit for generating an image charge corresponding to an image signal, and an image charge converting unit for converting the image charge into an electrical signal, wherein at least one of a plurality of transistors included in the image charge converting unit is a recess transistor including a channel region that is recessed into a substrate.

17 Claims, 8 Drawing Sheets

IMAGE SENSOR CELL, IMAGE SENSOR INCLUDING IMAGE SENSOR ARRAY INCLUDING PLURALITY OF THE IMAGE SENSOR CELLS, AND CAMERA SYSTEM INCLUDING THE IMAGE SENSOR

CROSS-REFERENCE TO RELATED APPLICATION

This application claims priority from Korean Patent Application No. 10-2010-0082086, filed on Aug. 24, 2010, in the Korean Intellectual Property Office, and entitled: "Image Sensor Cell, Image Sensor Including Image Sensor Array Including Plurality of the Image Sensor Cells, and Camera System Including the Image Sensor," and all the benefits accruing therefrom under 35 U.S.C. 119, the contents of which is incorporated by reference herein in its entirety.

BACKGROUND

1. Field

Embodiments relate to an image sensor cell, and more particularly, to an image sensor cell in which at least one of a plurality of transistors constituting the image sensor cell is a recess transistor having a channel region recessed into a substrate.

2. Description of the Related Art

Image sensor cells generate a charge corresponding to an image signal applied from the outside and convert the generated charge into an electrical signal corresponding thereto. The image sensor cell may roughly include an image charge generating unit for generating an image charge corresponding to an image signal and an image charge converting unit for generating an electrical signal corresponding to the image charge. The image signal generating unit may be configured as a photodiode. The image charge converting unit includes a reset transistor for resetting a floating diffusion area to a predetermined voltage in response to a reset control signal, a transfer transistor for transferring the image charge to the floating diffusion area, a conversion transistor for generating the electrical signal corresponding to the image charge transferred to the floating diffusion area, and a selection transistor for outputting the electrical signal in response to a selection control signal.

SUMMARY

One or more embodiments may provide an image sensor cell including an image charge generating unit and an image charge converting unit, wherein at least one of a plurality of transistors constituting the image charge converting unit is configured as a recess transistor having a channel region recessed into a substrate.

One or more embodiments may provide an image sensor including a photodiode and an image charge converting unit, wherein at least one of a plurality of transistors included in the image charge converting unit is configured as a recess transistor such that an effective channel length may be maintained or increased while a size of the transistor may be reduced, and, thus, many pixels may be included in a predetermined area, or a fill factor may be improved by enlarging a size of the photodiode of each pixel of the image sensor.

One or more embodiments may provide an image sensor including an image sensor array including a plurality of image sensor cells, which each include an image charge converting unit, wherein at least one of a plurality of transistors constituting the image charge converting unit is configured as a recess transistor having a channel region recessed into a substrate.

One or more embodiments may provide a camera system including an image sensor including an image charge converting unit, wherein at least one of a plurality of transistors constituting the image charge converting unit is configured as a recess transistor having a channel region recessed into a substrate.

One or more embodiments may provide an image sensor cell, including an image charge generating unit configured to generate an image charge corresponding to an image signal, and an image charge converting unit including a plurality of transistors and configured to convert the image charge into an electrical signal, wherein at least one of the plurality of transistors of the image charge converting unit is a recess transistor including a channel region that is recessed into a substrate.

The image charge generating unit may include at least one photodiode.

The image charge converting unit may include a reset transistor configured to reset a floating diffusion area to a predetermined voltage in response to a reset control signal, at least one transfer transistor configured to transfer the image charge to the floating diffusion area in response to a transfer control signal, a conversion transistor configured to generate the electrical signal corresponding to the image charge transferred to the floating diffusion area, and a selection transistor configured to output the electrical signal in response to a selection control signal, wherein the plurality of transistors include the reset transistor, the conversion transistor, and the selection transistor.

The image charge generating unit may include at least two photodiodes.

The image charge converting unit may include at least two transfer transistors configured to sequentially transfer image charges generated from the at least two photodiodes to the floating diffusion area in response to a transfer control signal, a reset transistor configured to reset the floating diffusion area to a predetermined voltage in response to a reset control signal, a conversion transistor configured to generate the electrical signal corresponding to each of the image charges sequentially transferred to the floating diffusion area from the at least two transfer transistors, and a selection transistor configured to output the electrical signal in response to a selection control signal, wherein the plurality of transistors includes the reset transistor, the conversion transistor, and the selection transistor.

In the image charge converting unit including two photodiodes, the reset transistor, the conversion transistor, and the selection transistor may be formed on one diffusion area pattern formed between the two photodiodes.

A channel of the recess transistor may have one of a quadrilateral, curved, or cylindrical shape.

One or more embodiments may provide an image sensor, including an image sensor array configured to generate an electrical signal corresponding to an image signal applied from the outside, a row driver configured to apply a control signal to the image sensor array, a correlated double sampling (CDS) block configured to detect two electrical signals output from each of unit image sensors of the image sensor array, a comparing block configured to compare the two electrical signals detected by the CDS block, and an analog to digital convertor (ADC) block configured to convert a result of the comparison output from the comparing block into a digital signal, wherein the image sensor array includes an image charge generating unit configured to generate an image charge corresponding to an image signal and an image charge converting unit configured to convert the image charge into an electrical signal, and at least one of a plurality of transistors of the image charge converting unit is a recess transistor including a channel region recessed into a substrate.

The image charge generating unit may include one photodiode.

The image charge converting unit may include a reset transistor configured to reset a floating diffusion area to a predetermined voltage in response to a reset control signal, at least one transfer transistor configured to transfer the image charge to the floating diffusion area in response to a transfer control signal, a conversion transistor configured to generate the electrical signal corresponding to the image charge transferred to the floating diffusion area, a selection transistor configured to output the electrical signal in response to a selection control signal, wherein the plurality of transistors include the reset transistor, the at least one transfer transistor, the conversion transistor, and the selection transistor.

The image charge generating unit may include at least two photodiodes.

The image charge converting unit may include at least two transfer transistors configured to sequentially transfer image charges generated from the at least two photodiodes to the floating diffusion area in response to a transfer control signal, a reset transistor configured to reset the floating diffusion area to a predetermined voltage in response to a reset control signal, a conversion transistor configured to generate the electrical signal corresponding to each of the image charges sequentially transferred to the floating diffusion area from the at least two transfer transistors, and a selection transistor configured to output the electrical signal in response to a selection control signal, wherein the plurality of transistors include the reset transistor, the conversion transistor, and the selection transistor.

In the image charge converting unit including two photodiodes, the reset transistor, the conversion transistor, and the selection transistor may be arranged on one diffusion area pattern formed between the two photodiodes.

A channel of the recess transistor may have one of a quadrilateral, curved, or cylindrical shape.

One or more embodiments may provide an image sensor cell, including at least one photodiode, and a plurality of transistors, wherein at least one of the plurality of transistors is a recess transistor having a channel region recessed into a substrate.

The plurality of transistors may include a reset transistor, a conversion transistor, and a selection transistor.

The reset transistor, a conversion transistor, and a selection transistor may all be recess transistors having a channel region recessed into a substrate.

The image sensor cell may include one first pair of photodiodes.

The reset transistor, the conversion transistor, and the selection transistor may be arranged between the first pair of photodiodes.

The image sensor cell may further include at least one second pair of photodiodes, wherein the reset transistor, the conversion transistor, and the selection transistor corresponding to the first pair of photodiodes are arranged between the first pair of photodiodes, offset to a side of the first pair of photodiodes and/or directly between the second pair of photodiodes.

BRIEF DESCRIPTION OF THE DRAWINGS

The above and other features will become more apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on" another element, it can be directly on the other layer or substrate, or intervening elements may also be present. It will also be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Further, e.g., it will be understood that when an element is referred to as being, e.g., "between" two elements, the element may or may not extend along a crossing the two elements, i.e., the element may, e.g., overlap a space between the two elements but offset to a side from the planes crossing the two elements. Like reference numerals refer to like elements throughout.

A unit image sensor cell may include an image charge converting unit including a photodiode for generating a charge corresponding to an image signal and a plurality of transistors for generating an electrical signal corresponding to the charge. When the number of pixels to be formed in an allocated area is increased, an area allocated to the unit image sensor cell is decreased, and consequently, an area of the photodiode is decreased. The area of the photodiode may be decreased at the same rate as the decrease in the area of the unit image sensor cell. However, when a size of any of the transistors constituting the image charge converting unit is simply scaled down, an effective channel length is decreased, thereby causing a leakage current and noise.

One or more embodiments may provide an image charge converting unit of a unit image sensor cell including recess transistors each having a channel region recessed into a substrate. As will be described later, recess transistors may occupy a relatively small area and have an increased channel length.

Figure 1:
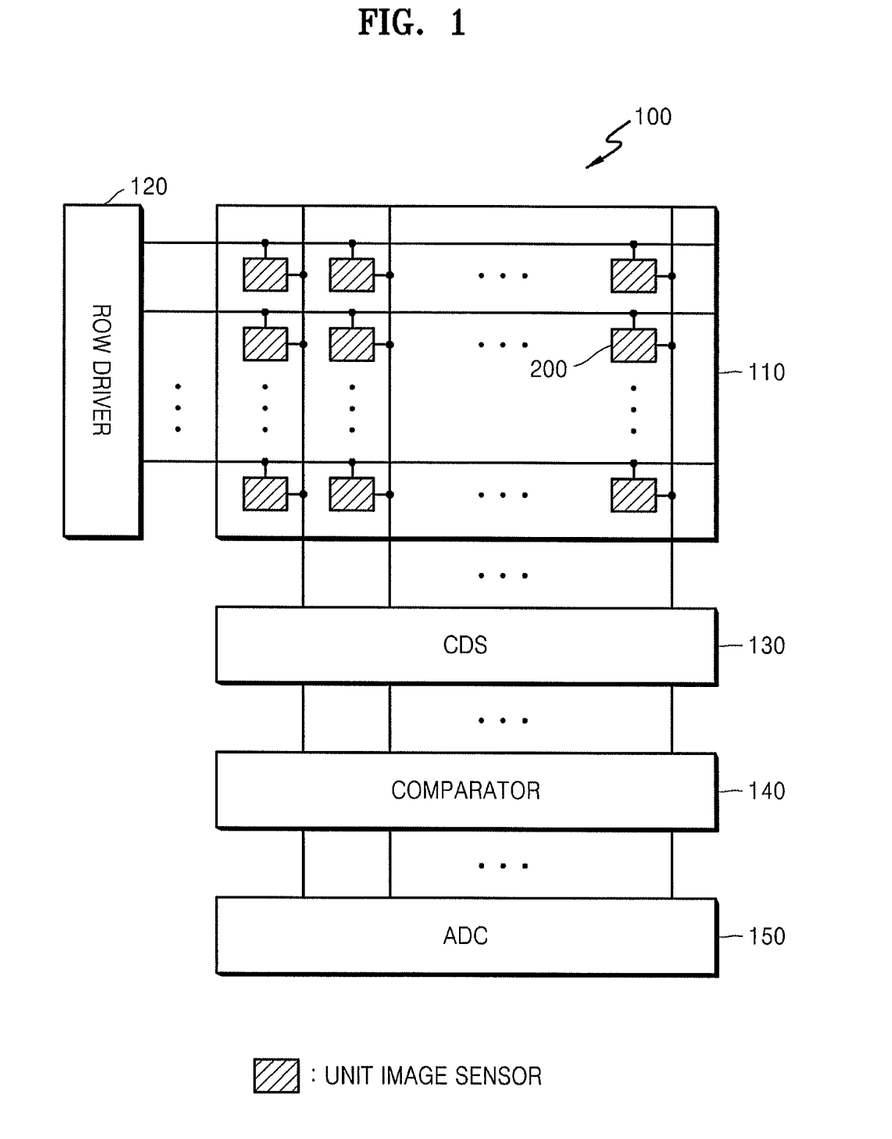
FIG. 1 illustrates a block diagram of an exemplary embodiment of an image sensor.

FIG. 1 illustrates a block diagram of an exemplary embodiment of an image sensor 100.

Referring to FIG. 1, the image sensor 100 may include an image sensor array 110, a row driver 120, a correlated double sampling (CDS) unit 130, a comparator 140, and an analog digital converter (ADC) 150.

The image sensor array 110 may include a plurality of unit image sensor cells 200 (portions filled in with diagonal lines) that are two-dimensionally arranged. Although not shown in FIG. 1, red, green, and blue color filters may be disposed on the unit image sensor cells 200.

The row driver 120 may operate the unit image sensor cells 200. More particularly, the row driver 120 may respectively operate rows of the unit image sensor cells 200 and may generate a plurality of control signals such as a reset control signal, a transfer control signal, and a selection control signal to drive the image sensor array 110. Each of the unit image sensor cells 200 may output an electrical signal corresponding to an image signal via a connected vertical line (e.g., column). As described below, each of the unit image sensor cells 200 may sequentially output an electrical signal due to a reset control signal and an electrical signal due to a transfer control signal.

The CDS 130 may extract a difference between the electrical signal due to the reset control signal and the electrical signal due to the transfer control signal sequentially output from the unit image sensor cells 200. The comparator 140 may compare the extracted difference with a reference signal. The ADC 150 may convert a result of the comparison performed by the comparator 140 into an analog signal.

An exemplary unit image sensor cell including an image charge generating unit including one photodiode and a common image sensor cell in which an image charge generating unit including at least two photodiodes will now be described.

Figure 2:
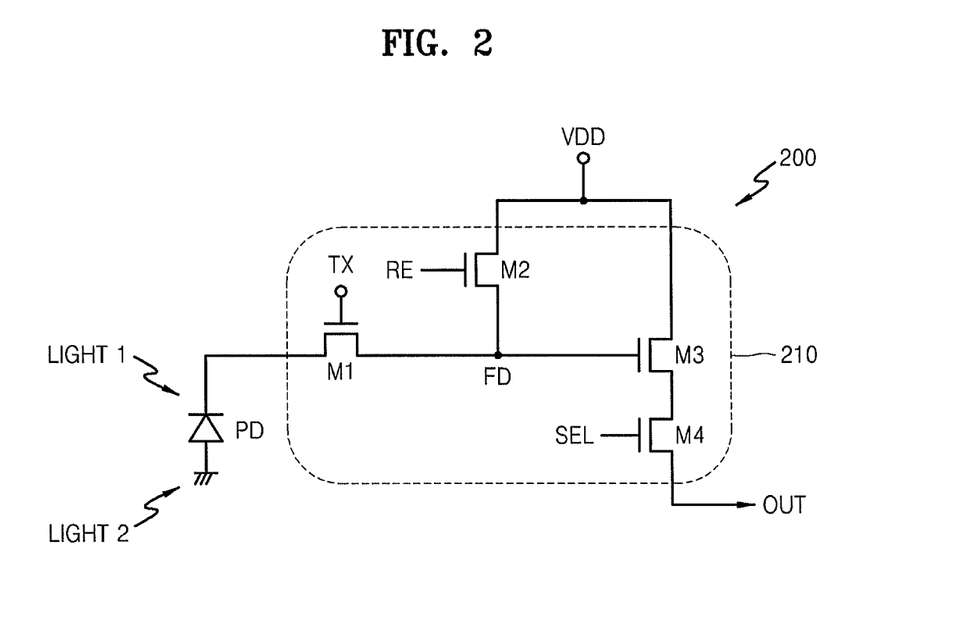
FIG. 2 illustrates a circuit diagram of an exemplary embodiment of a unit image sensor cell.

FIG. 2 illustrates a circuit diagram of an exemplary embodiment of the unit image sensor cell 200 of FIG. 1.

Referring to FIG. 2, the unit image sensor cell 200 may include a photodiode PD and an image charge converting unit 210 (shown within a dotted line).

The photodiode PD may correspond to an image charge generating unit and may generate an image charge corresponding to an image signal. When the image signal is received from above (LIGHT1), this is called a front illumination sensor (FIS). When an image signal is received from below (LIGHT2), this is called a backside illumination sensor (BIS). In this regard, above refers to an upper side of a semiconductor substrate, and below refers to a lower side of the semiconductor substrate. Light incident on the upper side of the semiconductor substrate may pass through a plurality of wiring layers and an insulating layer that are formed on the upper side of the semiconductor substrate, passes through the upper side of the semiconductor substrate, and then is incident in the semiconductor substrate. Light incident on the lower side of the semiconductor substrate may be directly incident in the semiconductor substrate without passing through the plurality of wiring layers and the insulating layer.

Hereinafter, a FIS will be mainly described, but it is easy to expand descriptions of the FIS to a BIS. In particular, a BIS does not require an optical symmetry of an electrical wiring disposed between transistors, and thus, one, some or all of features of the inventive concept may also be effectively used in the BIS.

The image charge converting unit 210 (shown within the dotted line) may include a transfer transistor M1, a reset transistor M2, a conversion transistor M3, and a selection transistor M4.

The transfer transistor M1 may transfer charges generated by the photodiode PD to a floating diffusion area FD in response to a transfer control signal Tx. The reset transistor M2 may reset the floating diffusion area FD to a voltage level of a power source voltage VDD in response to a reset control signal RE. The floating diffusion area FD may be reset to the power source voltage VDD. The floating diffusion area FD may be reset to a voltage lower or greater than the power source voltage VDD. The conversion transistor M3 may generate an electrical signal corresponding to a charge stored in the floating diffusion area FD. The conversion transistor may be referred to as a source follower, but the term 'conversion transistor' is used herein. The selection transistor M4 may transfer the electrical signal generated by the conversion transistor M3 to an output terminal OUT in response to a selection control signal SEL. In this regard, the output terminal OUT may be connected to a vertical line illustrated in the image sensor array 110 of FIG. 1.

Figure 3:
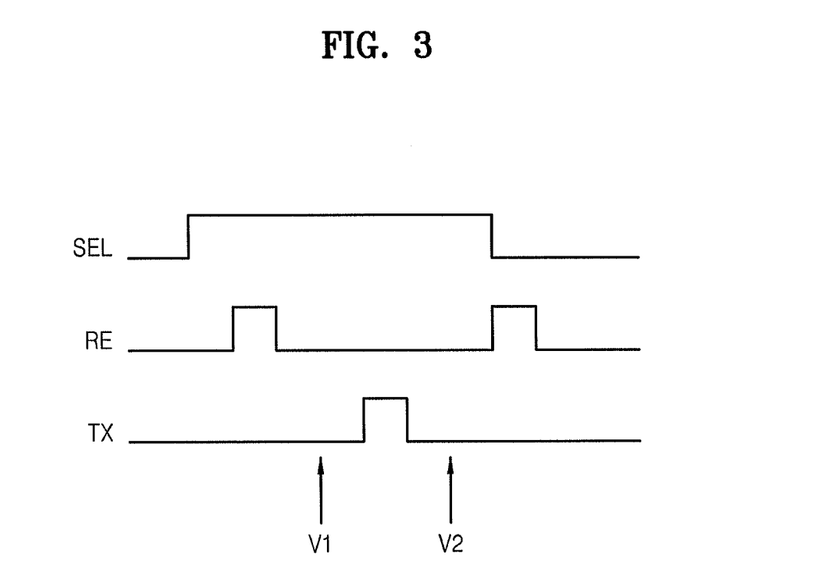
FIG. 3 illustrates a timing diagram of exemplary control signals employable for driving the unit image sensor cell of FIG. 2.

FIG. 3 illustrates a timing diagram of exemplary control signals employable for driving the unit image sensor cell 200 of FIG. 2.

Referring to FIG. 3, the unit image sensor cell 200 may be activated when the selection control signal SEL is in a logic high state. The reset control signal RE may then be activated to a logic high state for a predetermined period of time to reset the floating diffusion area FD. At this time, an electrical signal V1 corresponding to the reset floating diffusion area FD may be generated and output. Then, while the transfer control signal Tx is activated to a logic high state, a charge generated by the photodiode PD may be transferred to the reset floating diffusion area FD, and, thus, a charge amount accumulated in the floating diffusion area FD may be changed, thereby generating and outputting an electrical signal V2 corresponding to the changed charge amount. The image sensor 110 may use a difference between the electrical signal V1 and the electrical signal V2 output from the image sensor cell 200, as been described above.

Figure 4:
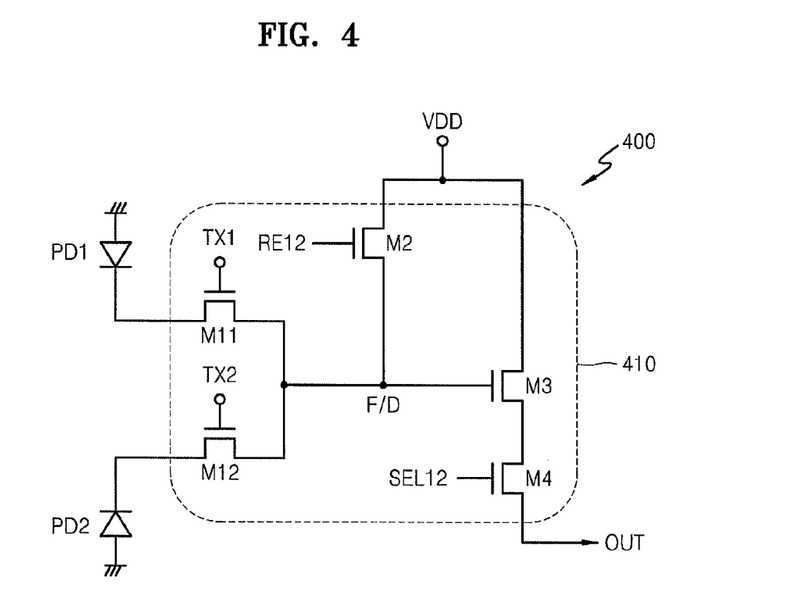
FIG. 4 illustrates a circuit diagram of an exemplary embodiment of a common image sensor cell.

FIG. 4 illustrates a circuit diagram of an exemplary embodiment of a common image sensor cell 400.

Referring to FIG. 4, in the common image sensor cell 400, an image charge generating unit may include two photodiodes PD1 and PD2. In the common image sensor cell 400, the two photodiodes PD1 and PD2 may operate in connection with one common image charge converting unit 410 (shown within a dotted line). The common image charge converting unit 410 may have the same structure as the image charge converting unit 210 illustrated in FIG. 2, but the charge converting unit 410 further includes a plurality of transfer transistors, e.g., M11, M12. Thus, in general, only differences between the exemplary embodiment of FIG. 2 and the exemplary embodiment of FIG. 4 will be described, e.g., a connection relationship of the common image charge converting unit will not be repeated. Exemplary operations of the common image charge converting unit 410 will be described below.

In FIG. 4, two photodiodes PD1 and PD2 are illustrated as sharing one common image charge converting unit 410, and, thus, the number of transfer transistors M11, M12 is two. Embodiments are not, however, limited thereto. For example, if four photodiodes share one common image charge converting unit, there may be four transfer transistors. Here, for convenience of description, the following embodiment is described assuming that two photodiodes share one common image charge converting unit.

Figure 5:
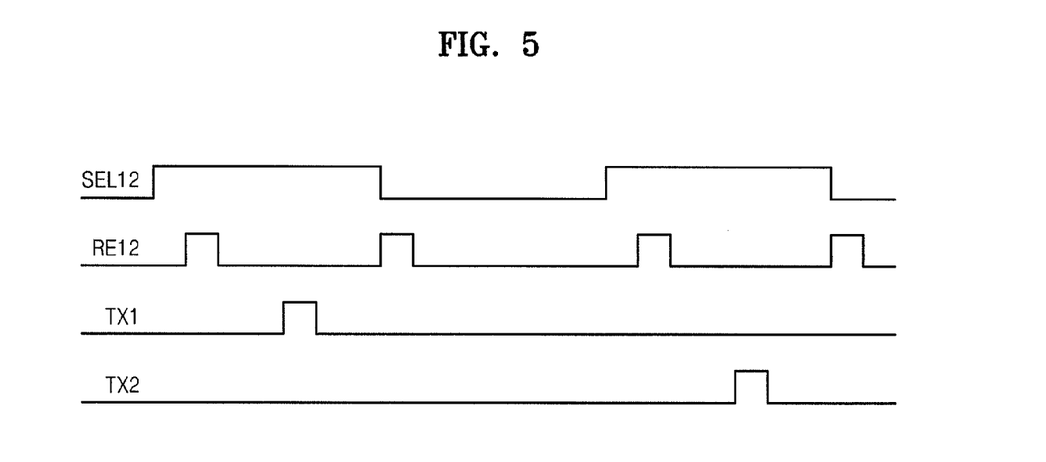
FIG. 5 illustrates a timing diagram of exemplary control signals employable for driving the common image sensor cell of FIG. 4.

FIG. 5 illustrates a timing diagram of exemplary control signals employable for driving the common image sensor cell 400 of FIG. 4.

Referring to FIG. 5, a selection control signal SEL12 is in an activated state twice, that is, a first activated state related to a first photodiode PD1 and a second activated state related to a second photodiode PD2.

Wave forms of a reset control signal RE12 and a first transfer control signal Tx1 when the selection control signal SEL12 is activated in the first activated state and wave forms of the reset control signal RE12 and a second transfer control signal Tx2 when the selection control signal SEL12 is activated in the second activated state are the same those described with reference to FIGS. 2 and 3. However, two transfer control signals are used in connection with two photodiodes, while the reset control signal RE12 and the selection control signal SEL12 are used in connection with a single line. In other words, the reset control signal RE12 and the selection control signal SEL12 are commonly used with respect to the plurality of photodiodes, e.g., the two photodiodes PD1, PD2, and, thus both reference numerals thereof include "12". If a reset control signal and a selection control signal are used with respect to third and fourth photodiodes, reference numerals of the reset control signal and the selection control signal would include "34".

Figure 6:
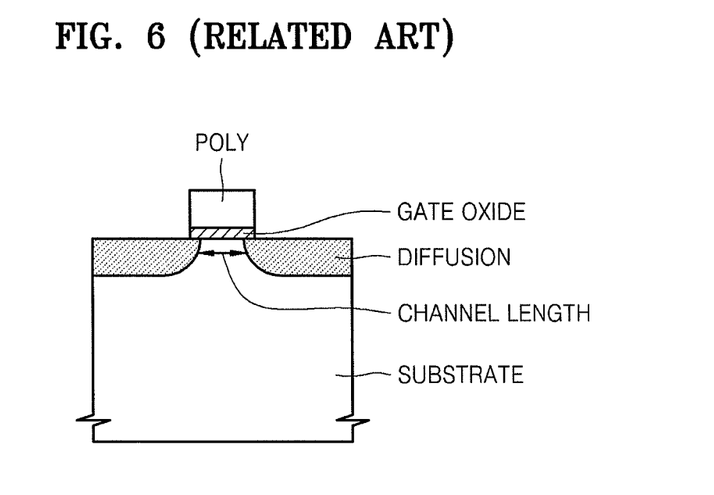
FIG. 6 illustrates a vertical cross-sectional view of a conventional MOS transistor.

FIG. 6 illustrates a vertical cross-sectional view of a conventional MOS transistor.

Referring to FIG. 6, in the conventional MOS transistor, a gate oxide layer GATE OXIDE is formed on a substrate in a horizontal direction, a gate terminal POLY is formed on the gate oxide layer GATE OXIDE. In general, lengths of the gate terminal POLY and the gate oxide layer GATE OXIDE are designed to be mostly the same. At this time, an effective channel length is less than a length of the gate oxide layer GATE OXIDE because the gate oxide layer GATE OXIDE is formed and then two diffusion areas DIFFUSION used as source and drain terminals of a transistor are annealed, and thus, the diffusion areas DIFFUSION are partially diffused downward.

In the conventional MOS transistor, a channel (that is, a portion indicated by an arrow) is formed between the two diffusion areas DIFFUSION under the gate oxide layer GATE OXIDE. In other words, the channel is formed on a surface of the substrate.

When the conventional MOS transistor is scaled down, a ratio of a channel length to a channel width of the MOS transistor does not change, but the channel length is decreased.

Figure 7:
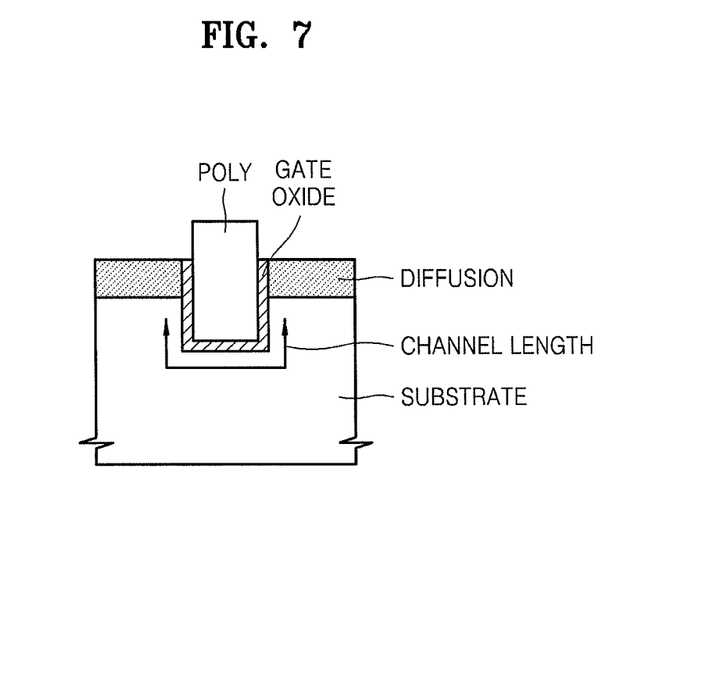
FIG. 7 illustrates a vertical cross-sectional view of an exemplary embodiment of a recess transistor having a quadrilateral channel.

FIG. 7 illustrates a vertical cross-sectional view of an exemplary embodiment of a recess transistor having a quadrilateral channel.

Referring to FIG. 7, in the recess transistor, a channel (that is, a portion indicated by an arrow) is formed inside a substrate and may not proceed along a surface of the substrate. The channel may extend in both horizontal and vertical directions according to a quadrilateral gate oxide layer GATE OXIDE. If the recess transistor is formed in the same area as where the conventional MOS transistor illustrated in FIG. 6 is formed, an effective channel length of the recess transistor illustrated in FIG. 7 may be greater than twice a horizontal length of the conventional MOS transistor illustrated in FIG. 6. In other words, in the same area, the effective channel length of the recess transistor may be greater than that of the conventional MOS transistor illustrated in FIG. 6.

Figure 8:
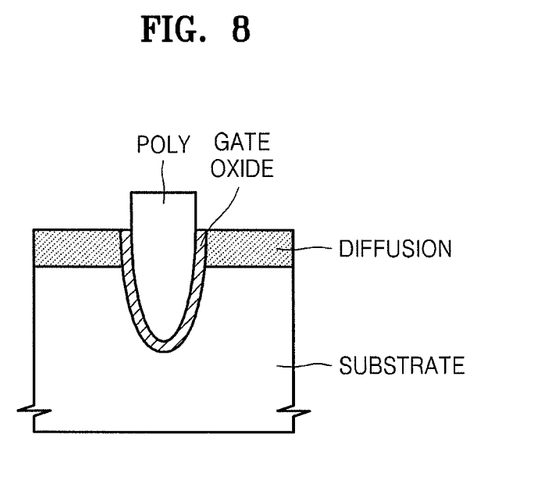
FIG. 8 illustrates a vertical cross-sectional view of an exemplary embodiment of a recess transistor having a curved channel.
Figure 9:
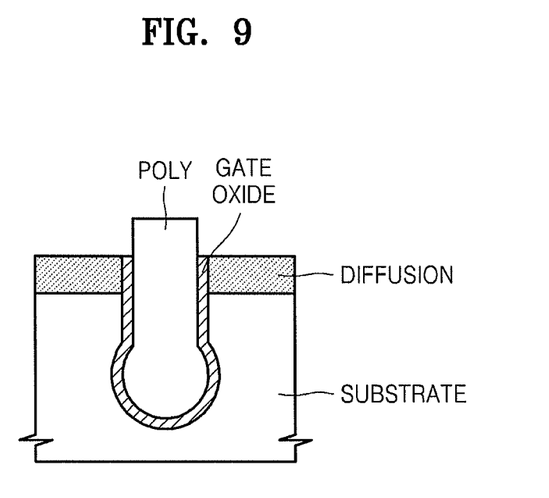
FIG. 9 illustrates a vertical cross-sectional view of an exemplary embodiment of a recess transistor having a cylindrical channel.

Referring to FIG. 7, in one or more embodiments, the channel may have a quadrilateral shape. Exemplary embodiments are not, however, limited thereto. For example, a shape of the channel may be modified in various ways, as illustrated in FIGS. 8 and 9. For example, FIG. 8 illustrates a vertical cross-sectional view of an exemplary embodiment of a recess transistor having a curved channel. FIG. 9 illustrates a vertical cross-sectional view of an exemplary embodiment of a recess transistor having a cylindrical channel. Manufacturing processes and characteristics of the recess transistors illustrated in FIGS. 8 and 9 are well known and, thus, will not be described here.

Figure 10:
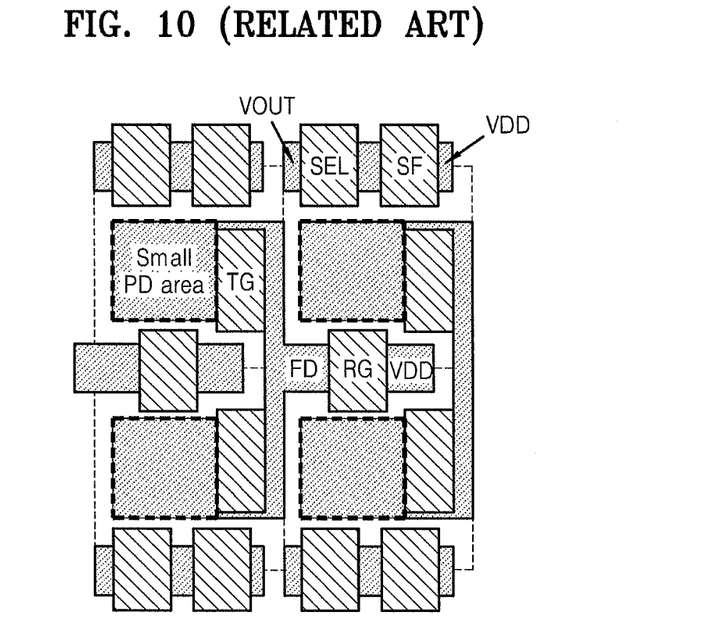
FIG. 10 illustrates a layout diagram of a conventional image sensor cell.

FIG. 10 illustrates a layout diagram of a conventional image sensor cell. Referring to FIG. 10, a common image sensor cell including four photodiodes (shown within thick dotted lines) each having a square shape is illustrated. As shown in FIG. 10, each pair of the four photodiodes disposed in a vertical direction share one common image charge converting unit. In FIG. 10, VDD denotes a voltage applied to the common image sensor cell, and VOUT denotes a voltage of an electrical signal that is output from the common image sensor cell. Squares filled in with diagonal lines are gate areas, squares filled in with dots, except for the photodiodes shown within the thick dotted lines, are diffusion areas, and areas shown within thin dotted lines are virtual areas allocated to the common image sensor cell.

The common image charge converting unit includes two transfer transistors TG respectively connected to the two photodiodes corresponding to the common image charge converting unit, a reset transistor RG, conversion transistors SF, and selection transistors SEL. The reset transistor RG is formed between the two photodiodes, the transfer transistors TG are formed on the right of the two photodiodes, the selection transistors SEL are respectively formed above and below the two photodiodes, and the conversion transistors SF are respectively formed above and below the two photodiodes, and, thus, areas allocated to the two photodiodes are reduced.

Figure 11:
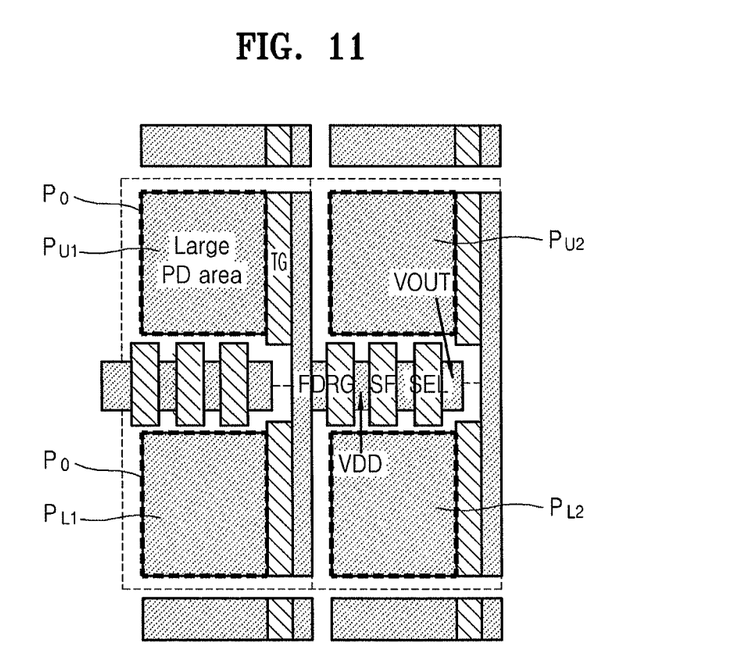
FIG. 11 illustrates a layout diagram of an exemplary embodiment of a common image sensor cell.

FIG. 11 illustrates a layout diagram of an exemplary embodiment of a common image sensor cell, e.g., 400 of FIG. 4.

Referring to FIG. 11, the common image sensor cell includes four photodiodes (shown within thick dotted lines), wherein each pair of the four photodiodes disposed in a vertical direction share one common image charge converting unit. The common image charge converting unit may include two transfer transistors respectively connected to two photodiodes, a conversion transistor, and a selection transistor. Further, in the exemplary embodiment of FIG. 11, however, embodiments are not limited thereto.

In the common image sensor cell illustrated in FIG. 11, the transistors included in the common image charge converting unit are formed substantially and/or completely within a boundary defined by outer surfaces Po of the four photodiodes, e.g., two pairs of upper and lower photodiodes $P_{u1}$ and $P_{L1}$, $P_{u2}$ and $P_{L2}$ and/or directly extending from at least a portion of the photodiodes $P_{u1}$, $P_{L1}$, $P_{u2}$, $P_{L2}$. Referring to FIG. 11, the transistors included in the common image charge converting unit are not formed above and below the photodiodes, e.g., the pair of photodiodes, $P_{u1}$, $P_{L1}$, associated with the common image charge converting unit. More particularly, assuming, e.g., that the pair of photodiodes, e.g., $P_{u1}$, $P_{L1}$, associated with the common image charge converting unit are stacked relative to a vertical direction such that one may be considered an upper photodiode and the other may be considered a lower photodiode and outer surfaces Po of the upper and lower photodiodes $P_{u1}$, $P_{L1}$ define upper and lower boundaries within which the transistors included in the common image charge converting unit substantially and/or completely exist. Referring to FIG. 11, e.g., two transfer transistors may be formed on a side, e.g., on the right side, of the upper and lower photodiodes $P_{u1}$, $P_{L1}$, i.e., the two transfer transistor directly extend from sides of the, e.g., upper and lower photodiodes $P_{u1}$, $P_{L1}$. Further, a reset transistor RG, a conversion transistor SF, and a selection transistor SEL associated with upper and lower photodiodes $P_{u1}$, $P_{L1}$ may be formed between the upper and lower photodiodes $P_{u1}$, $P_{L1}$. More particularly, the reset transistor RG, the conversion transistor SF, and the selection transistor SEL associated with upper and lower photodiodes $P_{u1}$, $P_{L1}$ may be formed between the upper and lower photodiodes $P_{u2}$, $P_{L2}$ adjacent to the upper and lower photodiodes $P_{u1}$, $P_{L1}$.

Referring to FIG. 11, in one or more embodiments, the reset transistor RG, the conversion transistor SF, and the selection transistor SEL may be formed on one diffusion area pattern formed between the photodiodes $P_{u1}$, $P_{L1}$. For example, corresponding ones of the reset transistor RG, the conversion transistor SF, and the selection transistor SEL corresponding, e.g., to a same one of the common image charge converting units, may be arranged in series. Further, the transfer transistors TG may also be connected in series with the corresponding ones of the reset transistor RG, the conversion transistor SF, and the selection transistor SEL corresponding, e.g., to a same one of the common image charge converting units. More particularly, the diffusion area on which the reset transistor RG, the conversion transistor SF, and the selection transistor SEL corresponding to the photodiodes $P_{u1}$, $P_{L1}$ are formed may extend between the adjacent photodiodes $P_{u2}$, $P_{L2}$.

Referring to FIGS. 10 and 11, areas allocated to the conventional photodiodes illustrated in FIG. 10 (small PD areas) are smaller than areas allocated to the exemplary embodiments of the photodiodes, e.g., $P_{u1}$, $P_{L1}$, $P_{u2}$, $P_{L2}$, illustrated in FIG. 11 (large PD areas). More particularly, e.g., a size difference between the small PD areas of FIG. 10 and the large PD areas of FIG. 11 results at least in part from the types of transistors used in the common image charge converting units. That is, in the conventional common image sensor cell illustrated in FIG. 10, the common image charge converting unit is formed by using conventional MOS transistors illustrated in FIG. 6, in which a channel is formed on a surface of a substrate. In the exemplary embodiment of the common image sensor cell illustrated in FIG. 11, the common image charge converting unit is formed by using recess type transistors as shown, e.g., in FIGS. 7 through 9, in which a channel is formed inside a substrate.

One or more embodiments may provide larger photodiodes while reducing and/or maintaining an overall area of an image sensor cell, e.g., 200, 400, by employing at least one recess type transistor.

By increasing an area of a photodiode, the photodiode may receive more image signals applied from the outside, and, thus, performance of the photodiode may be improved as compared to photodiodes having a smaller area.

FIG. 11 simply illustrates the image sensor cells for convenience of description, but embodiments are not limited thereto, e.g., arrangements of the common image charge converting units may be modified in various ways.

Figure 12:
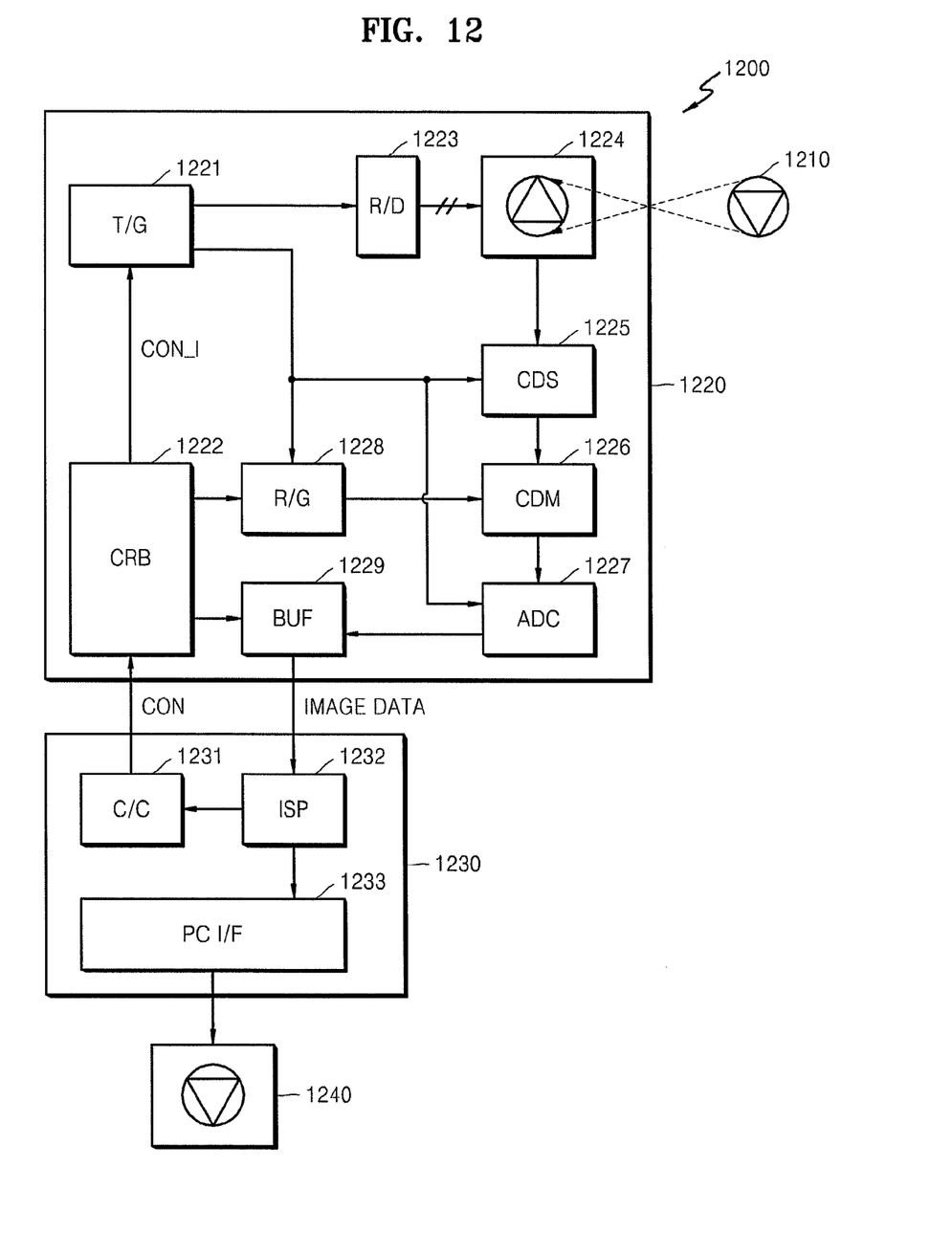
FIG. 12 illustrates a block diagram of an exemplary embodiment of a camera system.

FIG. 12 illustrates a block diagram of an exemplary embodiment of a camera system 1200.

Referring to FIG. 12, the camera system 1200 may include an image sensor block 1220, a signal processing block 1230, and a display 1240.

The image sensor block 1220 may receive an image signal applied from an external object 1210 in response to a control signal CON generated by the signal processing block 1230 and may generate image data corresponding to the received image signal.

The image sensor block 1220 may include a signal generator 1221, a control resistor block 1222, a vertical line driving block 1223, an image sensor array 1224, a CDS 1225, a comparator 1226, an ADC 1227, a lamp signal generator 1228, and a buffer 1229.

The signal generator 1221 may generate a clock signal for controlling operations of the vertical line driving block 1223, the lamp signal generator 1228, the CDS 1225, and the ADC 1227 in response to an internal control signal CON_I received from the control resistor block 1222.

The control resistor block 1222 may generate the internal control signal CON_I in response to the control signal CON received from the signal processing block 1230 and may control operations of the lamp signal generator 1228 and the buffer 1229.

The vertical line driving block 1223 may apply a signal necessary for the image sensor array 1224.

The image sensor array 1224 may generate an electrical signal corresponding to the image signal applied from the external object 1210.

The CDS 1225 may detect a difference between electrical signals received twice from photodiodes constituting the image sensor array 1224.

The comparator 1226 may compare a signal detected by the CDS 1225 with a reference signal in response to a lamp signal that is output from the lamp signal generator 1228.

The ADC 1227 may generate image data obtained by converting a signal generated by a result of comparison performed by comparator 1226 into a digital signal.

The lamp signal generator 1228 may generate a lamp signal according to a command of the control resistor block 1222.

The buffer 1229 may store the image data output from the ADC 1227 by a command of the control resistor block 1222 or may output the image data.

The signal processing block 1230 may receive the image data output from the buffer 1229 constituting the image sensor 1220, signal-process the image data, and transfer the signal-processed image data to the display 1240 so as to reproduce the image data. The signal processing block 1230 may include a camera controller 1231, an image signal processor 1232, and a personal computer (PC) interface 1233.

The camera controller 1231 may generate the control signal CON used to control an operation of the image sensor 1220.

The image signal processor 1232 may control an operation of the camera controller 1231. Also, the image signal processor 1232 may receive and process image data and may transfer the image data to the display 1240 via the PC interface 1233.

One or more embodiments of an image sensor employing one or more features described herein may be used in a general processor.

Figure 13:
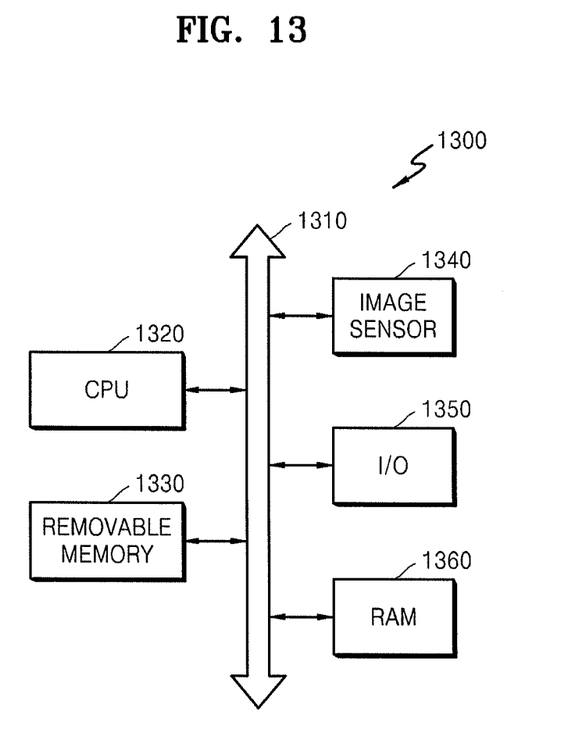
FIG. 13 illustrates a block diagram of an exemplary embodiment of a processor including an image sensor.

FIG. 13 illustrates a block diagram of an exemplary embodiment of a processor including an image sensor.

Referring to FIG. 13, the processor may include a central processing unit (CPU) 1320 for sending/receiving data via a bus 1310, a memory 1330 that is attachable or detachable, an image sensor 1340, an input/output device 1350, and a memory device 1360. The processor illustrated in FIG. 13 is illustrated as a general configuration, and may be modified in various forms.

The foregoing is illustrative of exemplary embodiments, and is not to be construed as limiting thereof. Although exemplary embodiments have been described, those of ordinary skill in the art will readily appreciate that many modifications are possible in the exemplary embodiments without materially departing from the novel teachings, and advantages of the exemplary embodiments. Accordingly, all such modifications are intended to be included within the scope of the claims. Exemplary embodiments are defined by the following claims, with equivalents of the claims to be included therein.

What is claimed is:

1. An image sensor cell, comprising:
an image charge generating unit configured to generate an image charge corresponding to an image signal; and
an image charge converting unit including a plurality of transistors and configured to convert the image charge into an electrical signal,
wherein a conversion transistor of the image charge converting unit is a recess transistor including a channel region that is recessed into a substrate.

2. The image sensor cell as claimed in claim 1, wherein the image charge converting unit includes:
a reset transistor configured to reset a floating diffusion area to a predetermined voltage in response to a reset control signal;
at least one transfer transistor configured to transfer the image charge to the floating diffusion area in response to a transfer control signal;
the conversion transistor configured to generate the electrical signal corresponding to the image charge transferred to the floating diffusion area; and
a selection transistor configured to output the electrical signal in response to a selection control signal,
wherein the plurality of transistors include the reset transistor, the conversion transistor, and the selection transistor.

3. The image sensor cell as claimed in claim 1, wherein the image charge converting unit further includes:
at least two transfer transistors configured to sequentially transfer image charges generated from at least two photodiodes to a floating diffusion area in response to a transfer control signal;
a reset transistor configured to reset the floating diffusion area to a predetermined voltage in response to a reset control signal;
the conversion transistor configured to generate the electrical signal corresponding to each of the image charges sequentially transferred to the floating diffusion area from the at least two transfer transistors; and
a selection transistor configured to output the electrical signal in response to a selection control signal,
wherein the plurality of transistors includes the reset transistor, the conversion transistor, and the selection transistor.

4. The image sensor cell as claimed in claim 3, wherein, in the image charge converting unit including the at least two photodiodes, the reset transistor, the conversion transistor, and the selection transistor are formed on one diffusion area pattern formed between the at least two photodiodes.

5. The image sensor cell as claimed in claim 1, wherein a channel of the recess transistor includes one of a quadrilateral, curved, or cylindrical shape.

6. An image sensor, comprising:
an image sensor array configured to generate an electrical signal corresponding to an image signal applied from the outside;
a row driver configured to apply a control signal to the image sensor array;
a correlated double sampling (CDS) block configured to detect two electrical signals output from each of unit image sensors of the image sensor array;
a comparing block configured to compare the two electrical signals detected by the CDS block; and
an analog to digital convertor (ADC) block configured to convert a result of the comparison output from the comparing block into a digital signal,
wherein the image sensor array includes an image charge generating unit, which includes at least two photodiodes, and configured to generate an image charge corresponding to an image signal and an image charge converting unit configured to convert the image charge into an electrical signal, and a conversion transistor of the image charge converting unit is a recess transistor including a channel region recessed into a substrate.

7. The image sensor as claimed in claim 6, wherein the image charge converting unit comprises:
a reset transistor configured to reset a floating diffusion area to a predetermined voltage in response to a reset control signal;
at least one transfer transistor configured to transfer the image charge to the floating diffusion area in response to a transfer control signal;
a conversion transistor configured to generate the electrical signal corresponding to the image charge transferred to the floating diffusion area; and
a selection transistor configured to output the electrical signal in response to a selection control signal,
wherein the plurality of transistors include the reset transistor, the at least one transfer transistor, the conversion transistor, and the selection transistor.

8. The image sensor as claimed in claim 6, wherein the image charge converting unit comprises:
at least two transfer transistors configured to sequentially transfer image charges generated from the at least two photodiodes to a floating diffusion area in response to a transfer control signal;
a reset transistor configured to reset the floating diffusion area to a predetermined voltage in response to a reset control signal;
the conversion transistor configured to generate the electrical signal corresponding to each of the image charges sequentially transferred to the floating diffusion area from the at least two transfer transistors; and
a selection transistor configured to output the electrical signal in response to a selection control signal,
wherein a plurality of transistors include the reset transistor, the conversion transistor, and the selection transistor.

9. The image sensor as claimed in claim 8, wherein, in the image charge converting unit including two photodiodes, the reset transistor, the conversion transistor, and the selection transistor are formed on one diffusion area pattern formed between the two photodiodes.

10. The image sensor as claimed in claim 6, wherein a channel of the recess transistor has one of a quadrilateral, curved, or cylindrical shape.

11. An image sensor cell, comprising:
at least two photodiodes; and
a plurality of transistors, wherein a conversion transistor of the plurality of transistors is a recess transistor having a channel region recessed into a substrate, and a reset transistor and the conversion transistor of the plurality of transistors are disposed between the at least two photodiodes.

12. The image sensor as claimed in claim 11, wherein the plurality of transistors include the reset transistor, the conversion transistor, and a selection transistor.

13. The image sensor as claimed in claim 12, wherein the reset transistor, the conversion transistor, and the selection transistor are all recess transistors having a channel region recessed into a substrate.

14. The image sensor as claimed in claim 12, including one first pair of photodiodes.

15. The image sensor as claimed in claim 14, wherein the reset transistor, the conversion transistor, and the selection transistor are arranged between the first pair of photodiodes.

16. The image sensor as claimed in claim 15, further including at least one second pair of photodiodes, wherein the reset transistor, the conversion transistor, and the selection transistor corresponding to the first pair of photodiodes are arranged between the first pair of photodiodes, offset to a side of the first pair of photodiodes and/or directly between the second pair of photodiodes.

17. The image sensor cell as claimed in claim 1, wherein a reset transistor and a selection transistor are recess transistors having a channel region recessed into the substrate.

* * * * *